United States Patent [19]

Shlomot

[11] Patent Number: 5,781,128
[45] Date of Patent: Jul. 14, 1998

[54] DATA COMPRESSION SYSTEM AND METHOD

[75] Inventor: Eyal Shlomot, Irvine, Calif.

[73] Assignee: Rockwell International Corporation, Newport Beach, Calif.

[21] Appl. No.: 801,890

[22] Filed: Feb. 18, 1997

[51] Int. Cl.$^6$ .................................................. H03M 7/00
[52] U.S. Cl. .......................................................... 341/51
[58] Field of Search .......................... 351/51; 364/972.4; 395/2.11, 2.41, 2.68

[56] References Cited

U.S. PATENT DOCUMENTS 5,005,206  4/1991  Naillon et al. ...................... 382/253

*Primary Examiner*—Brian K. Young
*Attorney, Agent, or Firm*—James P. O'Shaughnessy; William C. Cray

[57] ABSTRACT

A method and system for encoding an input signal for storage or transmission over a communications channel by transforming successive vectors of parameters of the input signal into a corresponding succession of index signals, each index signal being associated with a quantized vector that corresponds to an ordered set of values of the input signal parameters.

Supplying the input vector and a set of distance parameters to an artificial neural network for causing the artificial neural network to produce at least one control output signal; providing a vector quantization system composed of: at least one table having a first plurality of storage locations, each storage location storing a representative vector and having an address represented by a respective index signal; and search means for comparing each representative vector with each input signal parameter value; applying the at least one control output signal to the vector quantization system for identifying a second plurality of the storage locations, which second plurality is a subset of the first plurality of storage locations; searching, in said search means, over the second plurality of storage locations to locate that storage location of the second plurality which most closely approximates the extracted features vector according to a criterion utilizing the set of distance parameters; and outputting the index of the storage location which is found to most closely approximate the input vector.

16 Claims, 7 Drawing Sheets

DATA COMPRESSION SYSTEM AND METHOD

BACKGROUND OF THE INVENTION

The present invention relates to data compression and communication systems, and in particular to complexity reduction for vector quantization in speech, audio, image and video coding.

PRIOR ART

Modern communication systems rely heavily on data compression techniques for lossy coding of signals such as speech, audio, still images and video sequences. With the increase in computation power of specialized digital signal processors, data compression algorithms are now able to make use of the theoretically optimal technique of Vector Quantization (VQ). Examples of speech coding algorithms which utilize VQ are the recently introduced International Telecommunication Union (ITU) recommendations G.723.1 and G.729.

Current standards for the coding of high throughput signals such as audio, still images and video, do not employ VQ due to the high level of complexity needed for its implementation. Recent suggestions for a new standard for audio coding do include VQ.

VQ utilizes a large set of digital values, or vectors, each representing a possible value of some parameter of a signal, which parameter may be magnitude, phase, etc. Each vector is an ordered set of values and in digital implementation, these values are digital values. These values are stored at respective locations in a table, and each table location has an address, or index. Successive vectors of the input speech parameters are supplied to the VQ unit. Each vector is compared to the entries in the VQ table according to a predetermined distortion measure to identify the index of the table entry whose value is closest to the vector of parameters. This index is then stored or transmitted.

At the receiving end, the index is used as a pointer to an entry in a corresponding table having identical digital values at identical addresses, resulting in the retrieval of a lossy version of the original vector.

VQ has been found to provide an optimal solution for data compression, based on principles developed in the field of information theory. Many efficient and optimized algorithms presently exist for the design of VQ tables.

A typical prior art communication system utilizing VQ is shown in FIG. 1. This system includes a VQ encoder 100 at the transmitting side, and a VQ decoder 150 at the receiving side. At the input side, an input vector is applied on an input line 115 to a search unit 120 and to a comparison unit 130. The search unit 120 is connected to a VQ table 125 which consists of a plurality of memory locations each of which stores a vector value and has an address which is designated by an index. Under control of search unit 120, each input vector applied via line 115 is compared with each vector in table 125, this comparison being aided by distance parameters 135 which are inputted into comparison unit 130, and can be used for the calculation of the distortion measure. Then, the index associated with the table entry that is closest to the input vector is conducted via a line 140, from which it can either be stored or transmitted over a communication channel 145 to VQ decoder 150.

Decoder 150 is composed essentially of a retrieval unit 155 and a VQ table 160 which contains precisely the same data as VQ table 125. For each index transmitted via communication channel 145 and received by retrieval unit 155, the corresponding vector is read from table 160 and transferred to output line 165.

The operation of VQ units involves comparing each input vector with every table entry. This procedure requires considerable computation complexity and imposes substantial limits on the rate at which indices can be outputted by a given processor.

Other known VQ systems contain a plurality of smaller tables each storing vectors and the appropriate quantized vector will be represented by concantinating or combining a plurality of vectors, one from each smaller table. Each table might have fewer entries, or indices, than the single table of FIG. 1, so that each index consists of a smaller number of bits. Such an arrangement is known as a product VQ device.

An example of such a known product VQ device type is shown in FIG. 2 and is composed of a product VQ encoder 210 and a product VQ decoder 250. It will be seen that encoder 210 differs from encoder 100 of FIG. 1 essentially by the provision of a plurality of VQ tables 225 and by the provision of a plurality of inputs to comparison unit 230. In encoder 210, input vectors applied via line 215 are delivered to search unit 220 and comparison unit 230. These two units cooperate to successively compare the input vector with all the members of a set of combinations of vectors from at least one of tables 225, aided by the distance parameters supplied to comparison unit 230 via input 235. The indices associated with the stored values that, when combined, are closest to the input vector are delivered to output line 240 for either storage or transmission over communication channel 245.

After transmission over communication channel 245, each index is used to address a respective one of the multiple VQ tables 255 and the vector components stored at the address locations of the tables 255 are combined in unit 265 as an output vector which is delivered via an output line 270.

In each case, the output vector is a reproduction of a corresponding input vector, the output vector differing from the input vector by an error amount which is dependent on the specific coding scheme employed. As a general rule, the error will be a function of the number of entries in VQ tables 125 and 160 or multiple VQ tables 225 and 255.

The main drawback of a VQ scheme, and the primary reason it is not presently used in all data compression algorithms, is its prohibitive complexity. The search for the closest vector in a large table or even a few smaller tables requires a large number of arithmetic operations. For example, VQ search consumes up to 80% or 90% of the computation load for modern coding schemes for speech, such as the ITU standards G.723.1 and G.729.

SUMMARY OF THE INVENTION

It is a primary object of the present invention to ameliorate the drawbacks of known VQ systems.

Another object of the invention is to retain the advantages of VQ systems while increasing the speed and reducing the computation load required to effect VQ coding.

The above and other objects are achieved, according to the present invention, by a method for encoding an input signal for storage or transmission over a communications channel by transforming successive input vectors of a parameter of the input signal into a corresponding succession of index signals, each index signal being associated with a quantized vector that corresponds to an ordered set of values of the input signal parameters, the method comprising:

supplying the input vectors to an artificial neural network for causing the artificial neural network to produce at least one control output signal;

providing a vector quantization system composed of: at least one table having a first plurality of storage locations, each storage location storing a representative vector and having an address represented by a respective index signal; and search means for comparing each representative vector with each input signal parameter value;

applying the at least one control output signal to the vector quantization system for identifying a second plurality of the storage locations, which second plurality is a subset of the first plurality of storage locations;

searching, in said search means, over the second plurality of storage locations to locate that storage location of the second plurality which most closely approximates the extracted features vector according to a criterion utilizing the set of distance parameters; and outputting the index of the storage location which is found to most closely approximate the extracted features vector.

Objects according to the invention are further achieved by a system for encoding an input signal for storage or transmission over a communications channel by transforming successive vectors of parameters of the input signal into a corresponding succession of index signals, each index signal being associated with a quantized vector that corresponds to an ordered set of values of the input signal parameters, the system comprising:

means connected for supplying the input vector and the set of distance parameters to an artificial neural network for causing the artificial neural network to produce at least one control output signal;

means connected for providing a vector quantization system composed of: at least one table having a first plurality of storage locations, each storage location storing a representative vector and having an address represented by a respective index signal; and search means for comparing each representative vector with each input signal parameter value;

means connected for applying the at least one control output signal to the vector quantization system for identifying a second plurality of the storage locations, which second plurality is a subset of the first plurality of storage locations;

means connected for searching, in said search means, over the second plurality of storage locations to locate that storage location of the second plurality which most closely approximates the input vector according to a criterion utilizing the set of distance parameters; and means connected for outputting the index of the storage location which is found to most closely approximate the input vector.

DESCRIPTION OF THE PREFERRED EMBODIMENTS

As noted above, objects according to the invention are achieved by combining the functions of an artificial neural network with those of a conventional VQ system in a novel manner which combines the advantages of both systems so as to increase coding speed and decrease computational load.

An artificial neural network is formed by connecting together a plurality of elemental components which are known in the art as perceptrons.

Figure 3:
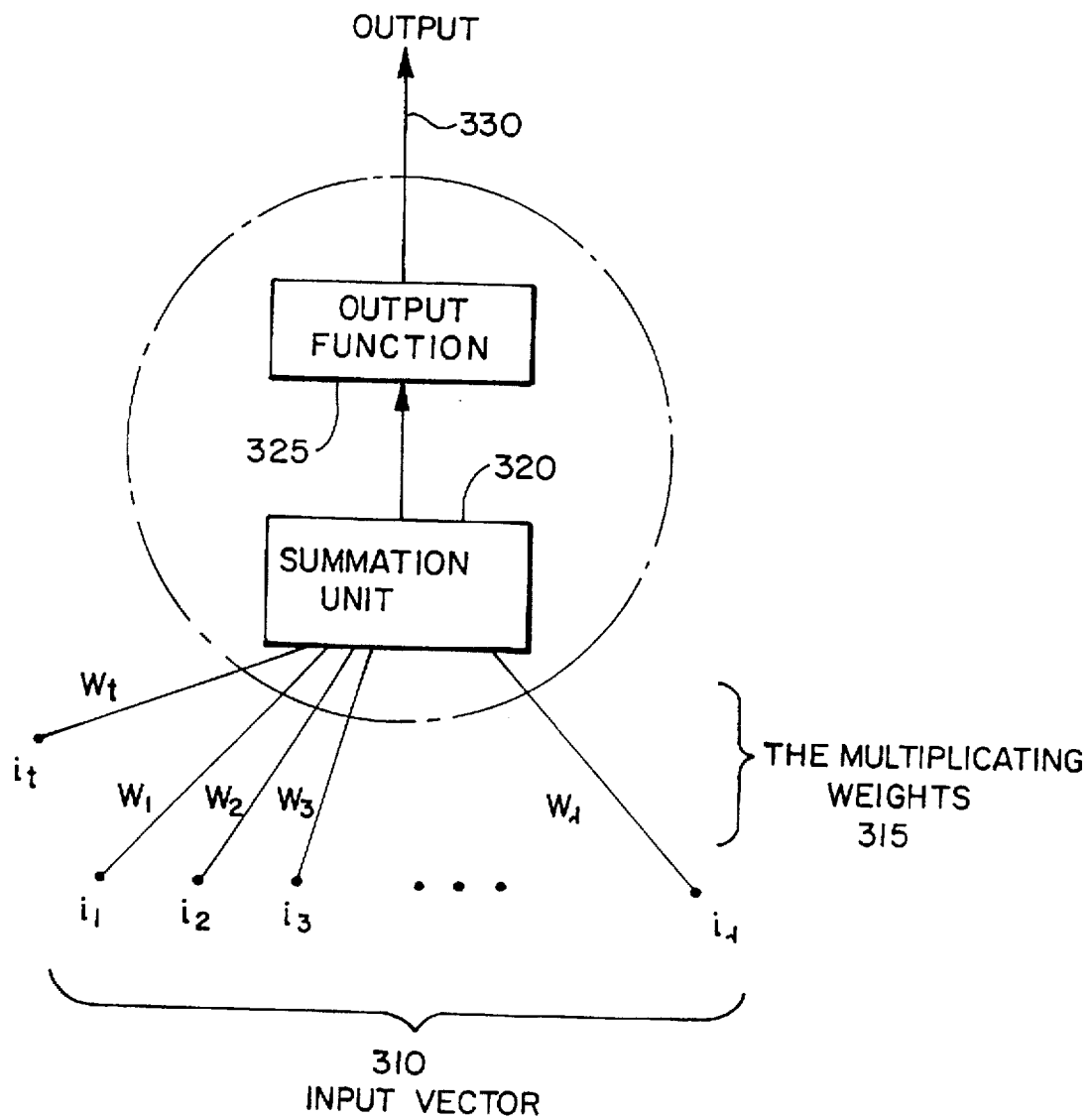
FIGS. 3 and 4 are block diagrams of, respectively, a component and a network of such components employed in embodiments of the present invention.

FIG. 3 is a block diagram showing the basic components of an exemplary perceptron composed of a plurality of input terminals 310, a summation unit 320, an output function generator 325 and an output terminal 330. Between each of the inputs 310 and summation unit 320, there are provided components which impart a selected weight, w, to the signal at the associated input. Thus, if the signal at an input has a value i, then the corresponding signal applied to summation unit 320 has a value wi. A further input may be connected to summation unit 320 to provide a signal having a fixed value for control purposes. For example, the further input, as shown, may receive a fixed value it and a weighting component providing a weight $w_t$ to provide a threshold value $i_t w_t$. Summation unit 320 generates a signal corresponding to the sum of all inputs wi and supplies this output to function generator 325. Function generator 325 can vary the signal at its input according to any desired function, linear or nonlinear, depending on the final result to be produced.

Figure 4:
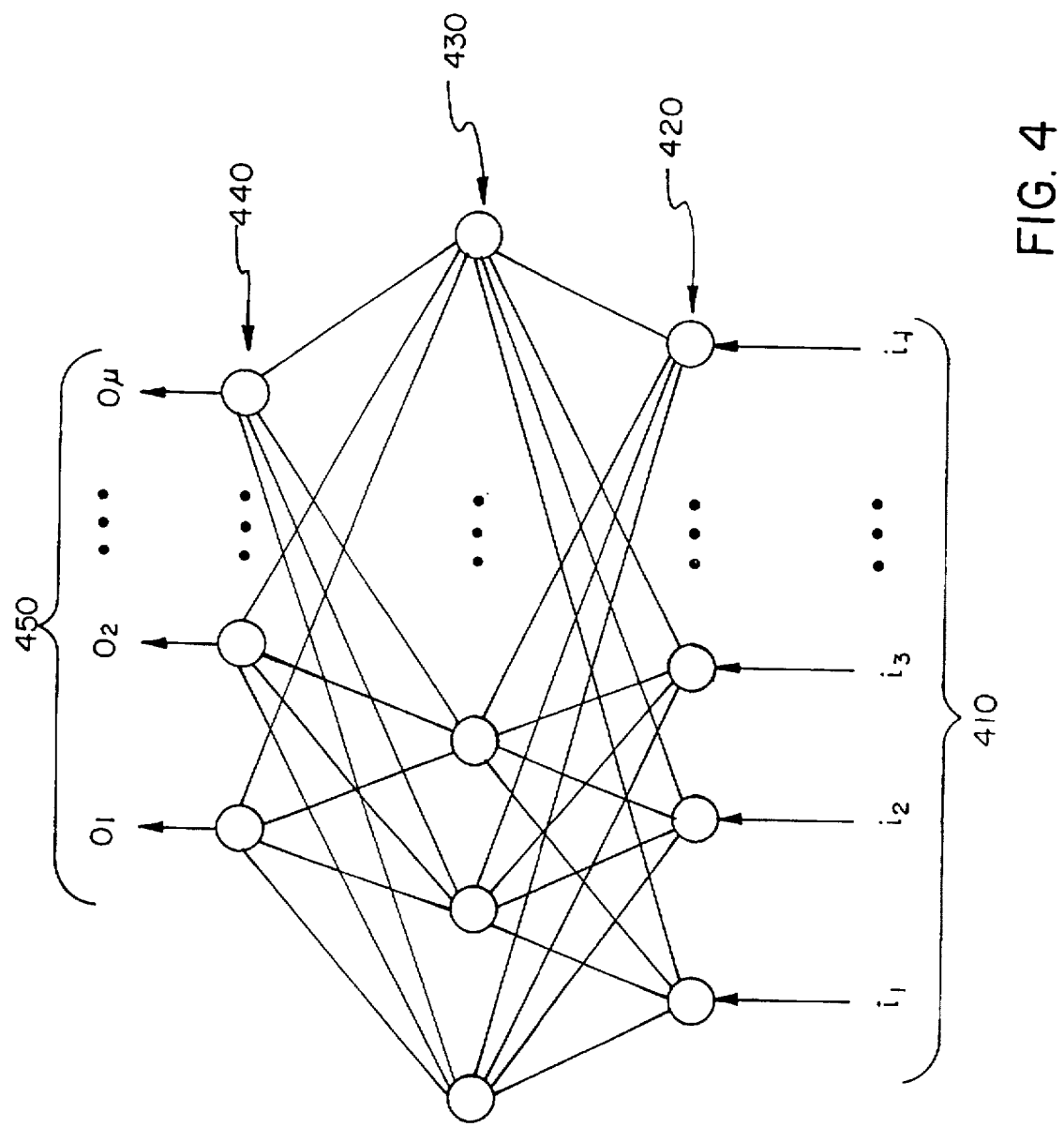

In order to form an artificial neural network, a plurality of perceptrons having the general form shown in FIG. 3 are assembled together into an artificial neural network having a plurality of layers, one example of which is shown in FIG. 4.

Each circle shown in FIG. 4 is a respective perceptron, having the form shown in FIG. 3. The artificial neural network illustrated in FIG. 4 consists of an input layer, a hidden layer and an output layer. In this illustrated embodiment, each perceptron of the input layer has a single input. However, each perceptron of input layer 420 may also have at least one additional input connected to receive a fixed signal for control purposes, i.e. for providing a threshold signal, or with a larger number of inputs.

The output of each perceptron of input layer 420 is connected to a respective input of one or more perceptrons of hidden layer 430. In the embodiment illustrated in FIG. 4, the output of each perceptron of input layer 420 is connected to the input of each perceptron of hidden layer 430. However, this is not required; the output of each perceptron of input layer 420 can be connected to less than all of the perceptrons of hidden layer 430. In addition, as in the case of the perceptrons of input layer 420, each perceptron of hidden layer 430 can be provided with a further input which receives a fixed signal for control purposes, and particularly for providing a threshold value.

Finally, the outputs of the perceptrons of hidden layer 430 are connected to respective inputs of the perceptrons of output layer 440. Again, the output of each perceptron of hidden layer 430 can be connected to the inputs of any number of perceptrons of output layer 440 and each perceptron of output layer 440 can be provided with a further input which receives a fixed signal for control purposes, and particularly for providing a threshold value. For the practice of the present invention, an artificial neural network having the form shown in FIG. 4 can be constructed according to principles well known in the art. For example, the fabrication of such a network is described in a text by Simon Haykin, entitled NEURAL NETWORKS, published by McMillan College Publishing Company, New York, 1994. Chapter 4 of this text describes the basic principles of the perceptron, while chapter 6 of the text describes multi-layer perceptrons, such as that shown in FIG. 4, constituting one class of neural networks.

As is clear from the above-cited text, an artificial neural network employed in the practice of the present invention can have any number of layers, any number of perceptrons in each layer, any combination of interconnections between layers, any combination of signal weights, and any number of outputs.

Each perceptron may be of the type which produces a binary output or of the type which produces an analog output. However, the perceptrons of the output layer 440 will normally be constructed to produce binary outputs and the set of outputs 450 will constitute a binary output vector.

The operation of an artificial neural network can be described as an input-output mapping and the mapping pattern is determined mainly by the weights, w, provided at the inputs of each perceptron. The most commonly used artificial neural networks are of the multi-layered, feed-forward type. Efficient algorithms, such as back-propagation algorithms, can be used for training such a network based on a labeled training set, i.e. a set of possible input vectors together with the desired output of the network for each vector. This type of training of an artificial neural network is also described in Sections 6.6–6.22 of the above-cited work by Haykin. By using different sets of weighting values, a given artificial neural network can produce different input-output mappings.

Since all of the perceptrons of each layer operate in parallel, the total time that will elapse between inputting of an input vector and outputting of a corresponding output vector will equal the number of neural network layers multiplied by the input-output processing, or mapping, time of one perceptron in each layer. In addition, since each layer processes signals in turn, input vectors could be delivered to inputs 410 at a frequency equal to the input-output mapping rate of each perceptron if the perceptrons are operated synchronously.

Artificial neural network theory states that any input-output mapping can be performed with a three-layer, feed-forward artificial neural network, assuming there are a sufficiently large number of perceptrons in the hidden layer. In practice, such a network can approximate an input-output mapping which is presented to it by a labeled training set.

According to the invention, the high speed mapping capabilities of artificial neural networks are combined with the more exact input-output mapping capabilities of a VQ system to arrive at a hybrid system which combines the advantages of both. In particular, the system according to the invention combines the optimal performance of VQ with the low complexity of artificial neural network systems.

VQ can be viewed as a classification technique. Each possible vector is classified into a represented vector, the entry in the table, and a represented index, the index of that entry. A set of vectors is represented by a single entry or a single index. VQ can also be viewed as an input-output mapping technique. The input is the original vector and the output is the represented vector (or the index of the represented vector in the VQ table).

Figure 1:
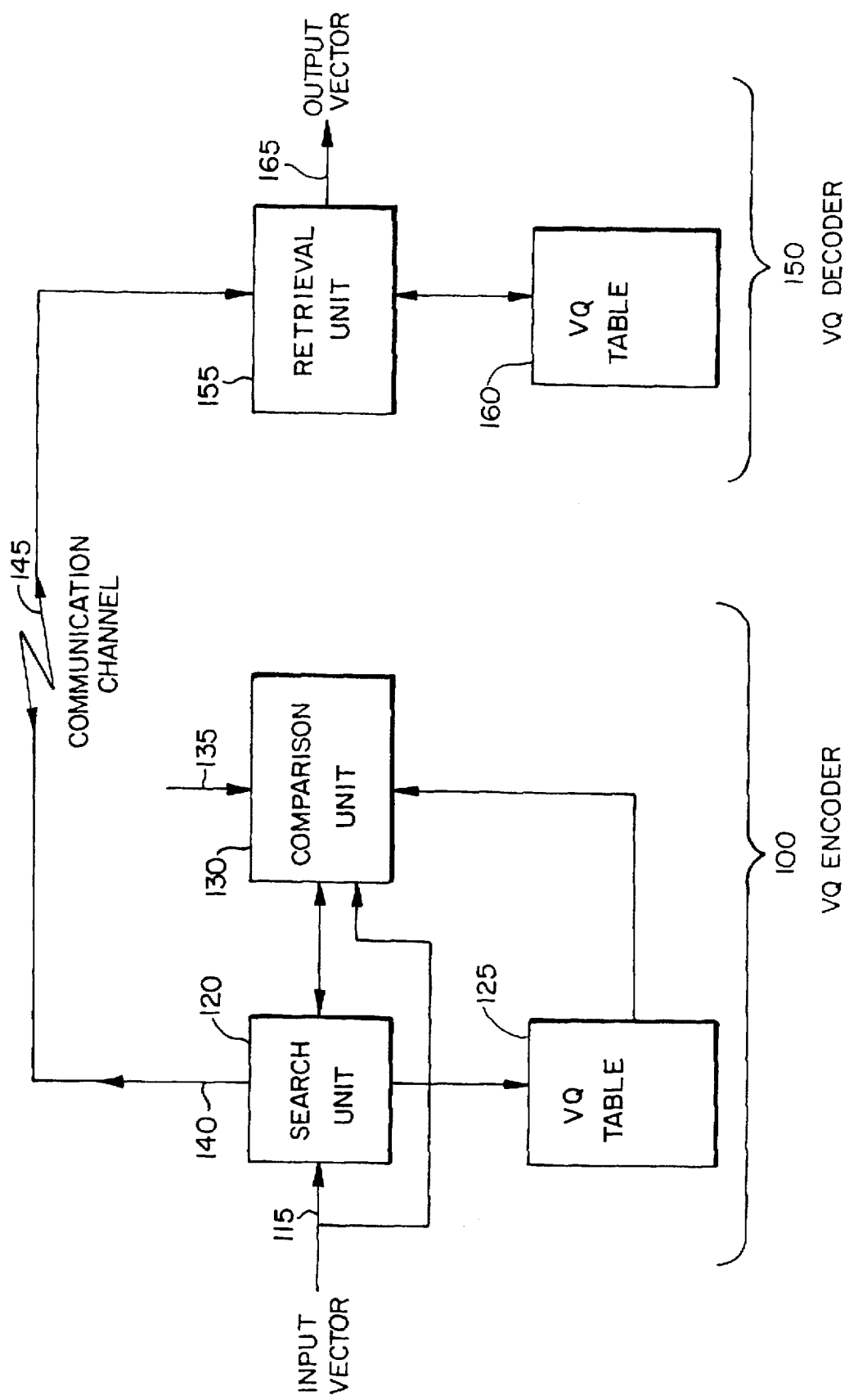
FIG. 1 is a block diagram showing a basic VQ system according to the prior art.
Figure 2:
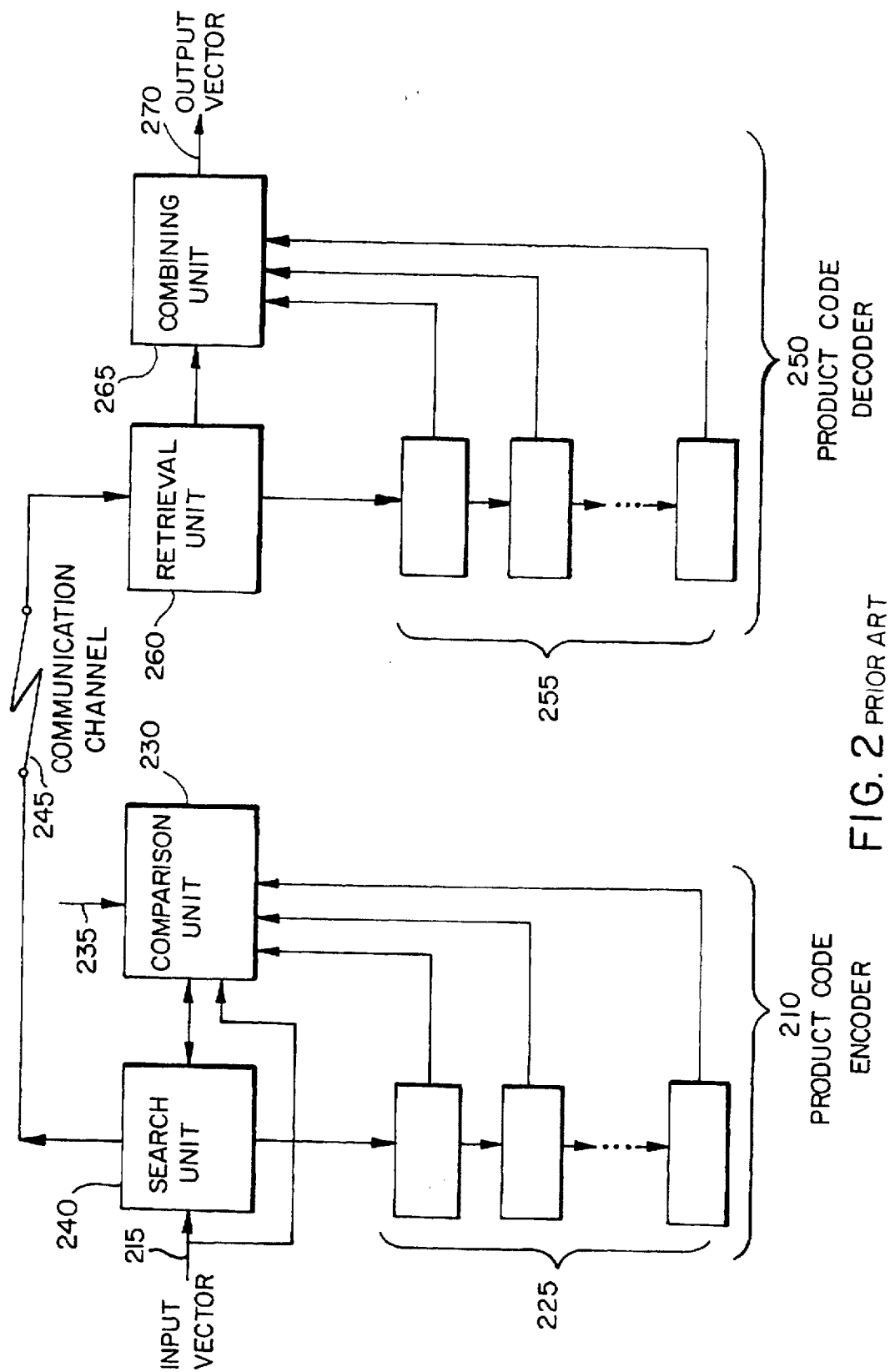
FIG. 2 is a view similar to that of FIG. 1 showing another form of construction of a VQ system according to the prior art.
Figure 5:
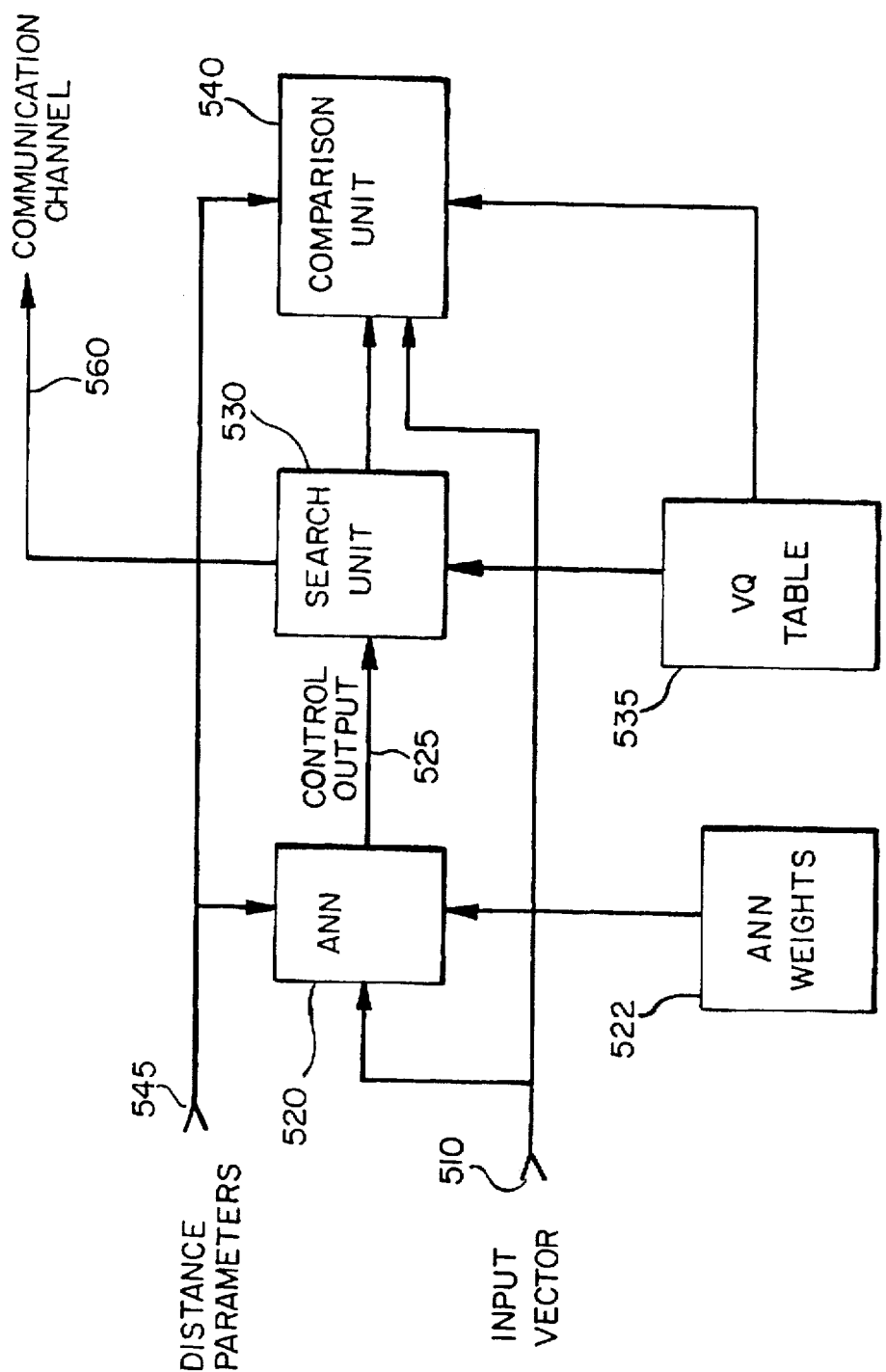
FIG. 5 is a block diagram showing one embodiment of an encoder according to the present invention.

One embodiment of a system according to the invention is shown in FIG. 5. The system includes an artificial neural network 520 having inputs 510 connected to receive input vectors and inputs connected to a suitable source of weighting values 522. The input vectors are the same as those applied to inputs 115 and 215 in FIGS. 1 and 2. Network 520 has control outputs 525 connected to inputs of a search unit 530. Search unit 530 is connected to a VQ table 535 and a comparison unit 540, the connections between, and operation of, search unit 530, table 535 and comparison unit 540 essentially being similar to those described with respect to FIG. 1.

However, according to the present invention, search unit 530 receives information identifying selected vectors from network 520, each of which vectors represents an index of table 535 where there is stored a vector that is proximate to the input vector supplied via line 510.

To cite one example, the output layer of neural network 520 may have a number of perceptrons equal to the number of entries in table 535 and the output of each output layer of network 520 is associated with a respective address, or entry, of table 535 and is connected to search unit 530. Network 520 will have been trained to respond to each input vector in a manner to cause the outputs of selected neural network output layer perceptrons to have a given value, for example a binary "1" value, these perceptrons being associated with quantized vectors closest to the input vector.

Alternatively, the output layer of neural network 520 can have a smaller number of perceptrons and the output of each output layer perceptron can be associated with a selected sub-set of entries in table 535. The number of perceptrons in the output layer can be less than, equal to, or greater than the number of entries in table 535.

The number of locations for which comparison is performed may be as small as 4 locations and as high as one-half, but preferably not higher than one-fourth, of all of the locations contained in table 535. In general, processing speed will be inversely proportional to the number of locations for which comparison is performed.

Once the index of the closest quantized vector is determined, with the aid of distance parameters supplied on lines 545 according to conventional practice in the vector quantization art, that index is transmitted over line 550 to communication channel 560. The transmitted indices will be decoded at the receiving side (not shown) in the same manner as in the prior art.

Figure 6:
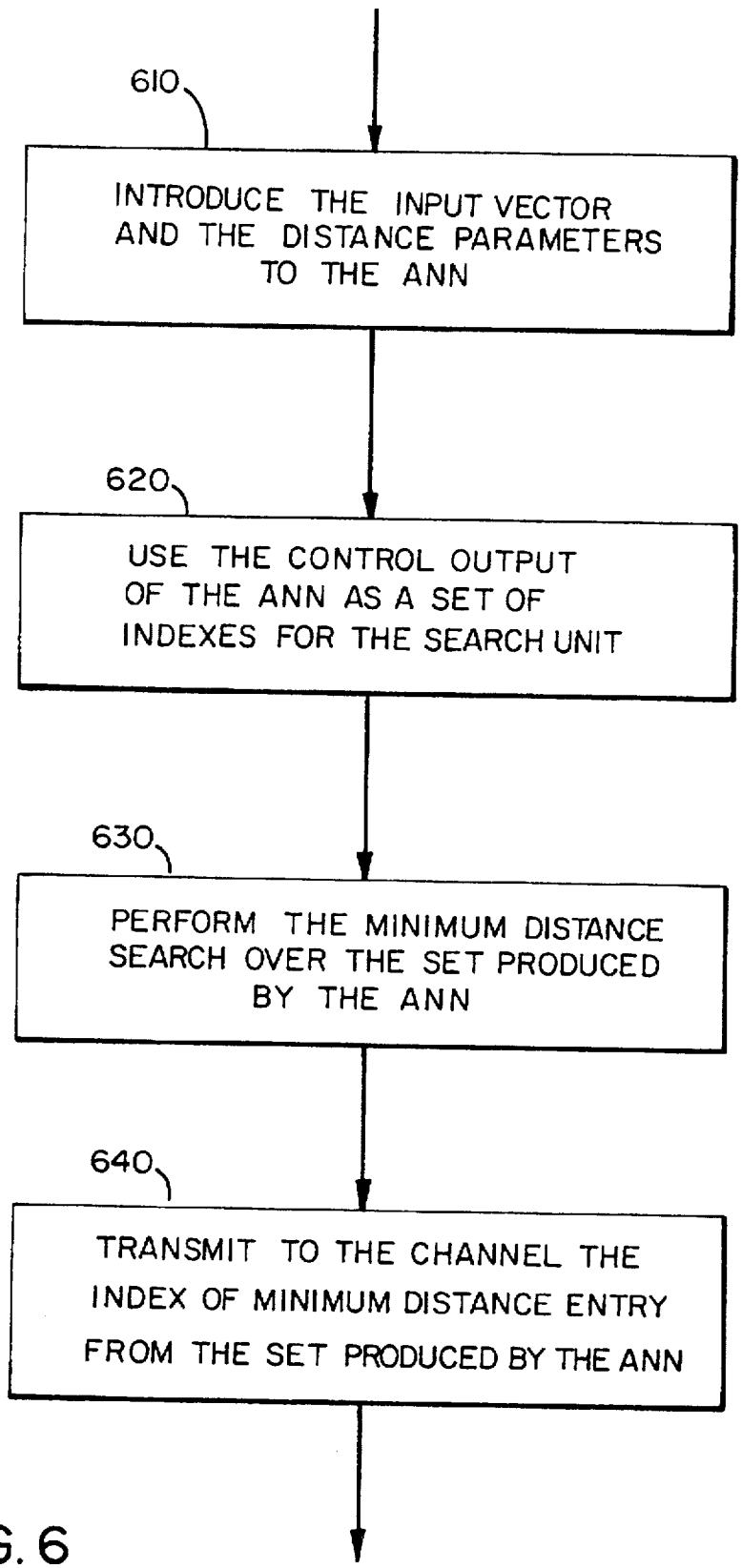
FIG. 6 is a flow chart showing the operation of the encoder of FIG. 5.

The basic steps of an encoding procedure according to the present invention are illustrated, in order to facilitate understanding, in the programming flow diagram of FIG. 6. As illustrated therein, the encoding procedure includes a step 610 for introducing input vectors and distance parameters to network 520 of FIG. 5. During, or prior to, this step, an appropriate set of weights can be supplied to network 520 from unit 522.

Then, in step 620, the output from network 520 is employed to identify a set of indices which are to be examined in table 535. This can be achieved either by providing a single index from network 520 and deriving therefrom a set of indices in search unit 530, or by directly supplying a set of indices from network 520.

In step 630, a minimum distance search is performed, under control of comparison unit 520, for each of the indices provided by search unit 530.

Finally, in step 640, the index of the quantized vector in table 535 having the minimum distance from the associated input vector is transmitted as index 550 to communication channel 560.

The same concept of complexity reduction using ANN with a single table VQ can be extended to product code VQ systems, where a plurality of tables is used to represent the input vector. A subset of entries from each table can be pre-selected by an ANN in order to reduce the complexity of the VQ search. A plurality of ANNs, each corresponding and operating with at least one VQ table, can be used. A single ANN with a loadable set of weights can also be employed to select the subset of entries from each table in a sequential manner.

Figure 7:
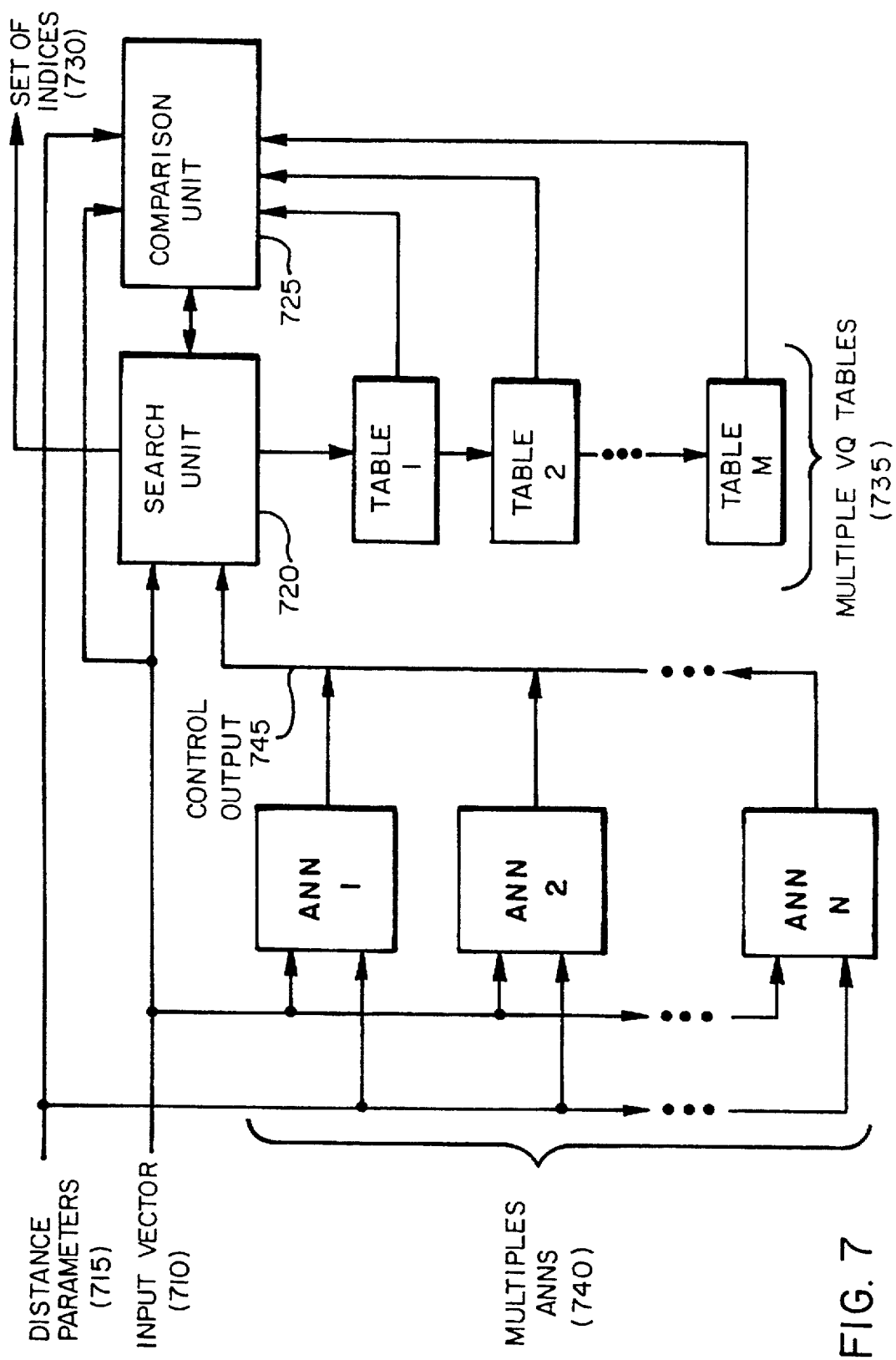
FIG. 7 is a block diagram showing a second embodiment of an encoder according to the present invention.

FIG. 7 depicts such a product VQ encoder with a set of ANNs used for complexity reduction. The input vector (710) and the distance parameters (715) are applied to the set of ANNs (740). The set of ANNs produces the control output signals (745) which are used by the search unit (720) for reduced complexity search in the set of VQ tables (735), using the comparison unit (725) to produce the set of indices (730).

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed:

1. A method for encoding an input signal for storage or transmission over a communications channel by transforming successive input vectors of parameters of the input signal into a corresponding succession of index signals, each index signal being associated with a quantized vector that corresponds to an ordered set of values of the input signal parameters, said method comprising:

supplying the input vectors to an artificial neural network for causing the artificial neural network to produce at least one control output signal;

providing a vector quantization system composed of: at least one table having a first plurality of storage locations, each storage location storing a representative vector and having an address represented by a respective index signal; and search means for comparing each representative vector with each input signal parameter value;

applying the at least one control output signal to the vector quantization system for identifying a second plurality of the storage locations, which second plurality is a subset of the first plurality of storage locations;

searching, in said search means, over the second plurality of storage locations to locate that storage location of the second plurality which most closely approximates the input vector according to a criterion utilizing the set of distance parameters; and outputting the index of the storage location which is found to most closely approximate the input vector.

2. A method as defined in claim 1 wherein the second plurality is less than one-half of the first plurality.

3. A method as defined in claim 1 wherein the second plurality is less than one-fourth of the first plurality.

4. A system for encoding an input signal for storage or transmission over a communications channel by transforming successive input vectors of parameters of the input signal into a corresponding succession of index signals, each index signal being associated with a quantized vector that corresponds to an ordered set of values of the input signal parameters, said system comprising:

at least one artificial neural network;

means connected for supplying the input vector to the at least one artificial neural network for causing the artificial neural network to produce at least one control output signal;

a vector quantization system composed of: at least one table having a first plurality of storage locations, each storage location storing a representative vector and having an address represented by a respective index signal; and search means for comparing each representative vector with each input signal parameter value;

means connected for applying the at least one control output signal to the vector quantization system for identifying a second plurality of the storage locations, which second plurality is a subset of the first plurality of storage locations;

means connected for searching, in said search means, over the second plurality of storage locations to locate that storage location of the second plurality which most closely approximates the input vector according to a criterion utilizing the set of distance parameters; and means connected for outputting the index of the storage location which is found to most closely approximate the input vector.

5. A system as defined in claim 4 wherein the input signal received by said artificial neural network is a digital signal composed of a number of bits, said artificial neural network has a plurality of inputs each connected to receive a respective bit of the digital signal, and the set of output signals derived by said artificial neural network correspond to the addresses of the second plurality of storage locations.

6. A system as defined in claim 5 wherein said artificial neural network has a plurality of outputs each associated with at least one storage location of the second plurality of storage locations.

7. A system as defined in claim 6 wherein each output of the artificial neural network is associated with a set of storage locations of the second plurality of storage locations.

8. A system as defined in claim 4 wherein the second plurality is less than one-half of the first plurality.

9. A system as defined in claim 4 wherein the second plurality is less than one-fourth of the first plurality.

10. A system as defined in claim 4 wherein said at least one table comprises a plurality of tables each having a first plurality of storage locations and each storing quantized vectors representing a portion of a respective index signal.

11. A system as defined in claim 4 wherein said at least one table comprises a plurality of tables.

12. A system as defined in claim 11 wherein said at least one artificial neural network comprises a plurality of artificial neural networks for supplying respective control output signals each corresponding to at least one of said plurality of tables.

13. A system as defined in claim 12 wherein each artificial neural network is associated with a respective table.

14. A system as defined in claim 12 wherein each artificial neural network has a plurality of inputs, each for receiving a portion of the input vector, and means for imparting a weight having a selected value to each input vector portion.

15. A system as defined in claim 14 further comprising means connected for supplying different weight values to each artificial neural network.

16. A system as defined in claim 15 wherein each artificial neural network is associated with a plurality of tables and imparts weights having different values to the input vector portions for supplying a different control output signal to each of the plurality of associated tables.

* * * * *